US010840925B1

(12) United States Patent
Delfyett et al.

(10) Patent No.: US 10,840,925 B1
(45) Date of Patent: Nov. 17, 2020

(54) HARMONIC INJECTION LOCKING APPARATUS, METHODS, AND APPLICATIONS

(71) Applicant: University of Central Florida Research Foundation, Inc., Orlando, FL (US)

(72) Inventors: Peter J. Delfyett, Orlando, FL (US); Ricardo Bustos Ramirez, Orlando, FL (US); Michael E. Plascak, Orlando, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 0 days.

(21) Appl. No.: 16/410,401

(22) Filed: May 13, 2019

(51) Int. Cl.
*H03L 7/20* (2006.01)
*H01S 3/11* (2006.01)
(52) U.S. Cl.
CPC .............. *H03L 7/20* (2013.01); *H01S 3/1121* (2013.01)

(58) Field of Classification Search
CPC ........................................................ H03L 7/20
USPC ........................................................... 331/46
See application file for complete search history.

(56) References Cited

U.S. PATENT DOCUMENTS

2008/0024787 A1* 1/2008 Kaertner ................. G01J 9/02
356/460

* cited by examiner

*Primary Examiner* — Joseph Chang
(74) *Attorney, Agent, or Firm* — Klintworth & Rozenblat IP LLP

(57) ABSTRACT

Apparatus and methods demonstrate a chip-scale direct optical to RF link that frequency divides up to 120 GHz optical frequency combs to 10 GHz using harmonic multi-tone injection locking. The embodied invention links widely separated optical frequency combs in the millimeter wave regime (>120 GHz) or THz domain (100s of GHz to THz domain), e.g., microresonator-based frequency combs, which are currently outside of the photo-detection region, into the microwave domain (10s of GHz) where it can be easily photo-detected and controlled. The technique works as a perfect optical divider, using a mode-locked laser and optical injection locking as the technique to phase-lock both lasers.

11 Claims, 9 Drawing Sheets

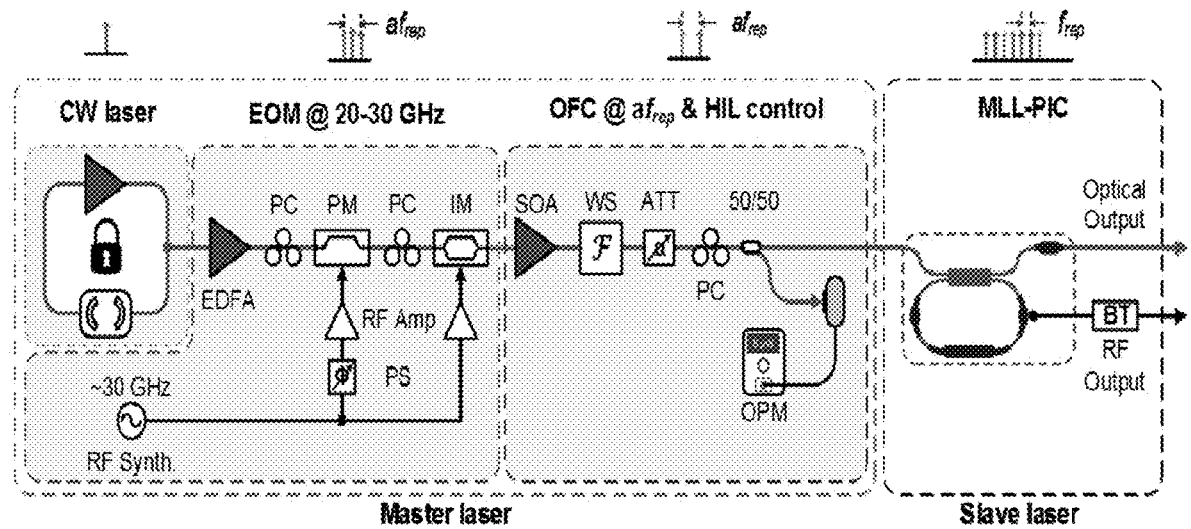
Fig. 2(a)
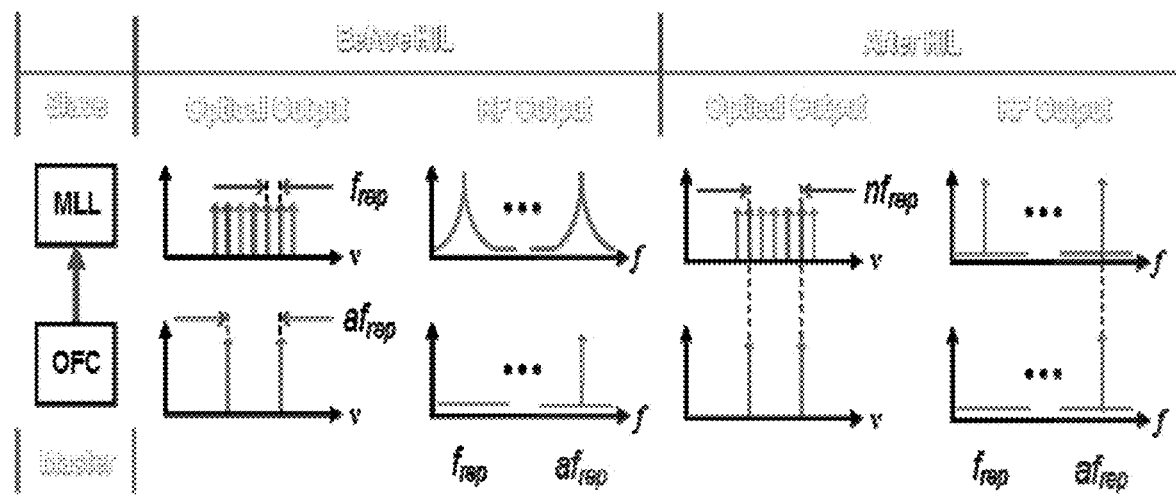
Fig. 2(b)
FIG. 2

HARMONIC INJECTION LOCKING APPARATUS, METHODS, AND APPLICATIONS

GOVERNMENT FUNDING

Funding for the invention was provided by Defense Advanced Research projects Agency (DARPA) under contract DARPA DODOS Program under Grant HR0011-15-C-0057 and National Science Foundation (NSF) under Grant 1509619. The U.S. government has certain rights in the invention.

RELATED APPLICATION DATA

N/A.

BACKGROUND

Non-limiting aspects and embodiments most generally pertain to the field of optical injection locking; more particularly to harmonic multi-tone injection locking apparatus, methods, and applications thereof, and, most particularly to an optical-to-RF link apparatus, methods, and applications thereof.

Generation of widely spaced optical frequency combs are a powerful technology with applications ranging from precision metrology to photonic signal processing. When the carrier-envelope offset, $f_0$, and the repetition rate, $f_{rep}$, are fully known, a frequency comb can be used to make precise time measurements, or to measure Doppler shifts in astronomical objects, amongst others. For some of these applications, compact and robust systems are usually desired. In recent years, the use of chip-scale microresonator-based optical frequency combs, where the frequency separation between optical modes can go as high as ~1 THz, has made possible to consistently obtain a coherent octave. On the other hand, semiconductor-based mode-locked lasers (MLL) provide a compact, robust and reliable technology at repetition rates in the microwave regime (1-10s of GHz) that can be easily photo-detected and controlled. However, due to the high-repetition rate of chip-scale MLLs, the generation of a coherent octave-spanning supercontinuum needed for $f_o$ detection is challenging due to the low peak power of the pulses. Other methods to obtain a self-referenced optical frequency comb either have not been miniaturized to chip-scale or use two microresonator-based frequency combs locked via optoelectronic phase-locked loops, which has an impact on the long-term robustness of the system and increases the electronic complexity of the overall frequency comb.

The inventors have recognized the advantages and benefits of simple, efficient, robust, and stable apparatus and methods to directly link non-photodetectable optical bandwidths (GHz-THz regime) to the directly photodetectable microwave regime (10s of GHz). Such apparatus and methods are enabled as described herein below and in the appended claims.

SUMMARY

An embodiment of the invention is a timing signal generator. In an exemplary aspect the timing signal generator includes a slave oscillator having a free-running frequency that is a sub-harmonic of a non-directly detectable master oscillator terahertz (THz) frequency input to the slave oscillator, wherein when the slave oscillator free-running frequency is injection locked by the non-directly detectable master THz frequency, the slave oscillator has an output in a bandwidth that is directly detectable. In various non-limiting, exemplary embodiments and aspects the timing signal generator may have one or more of the following features, characteristics, limitations, or functions alone or in various combinations:

wherein the slave oscillator output is at least one of directly optically detectable and directly electrically detectable;
  wherein the slave oscillator is a mode-locked laser (MLL) photonic integrated circuit (PIC);
    wherein the MLL-PIC comprises a ring laser and a 2×2 multimode interference coupler;
    wherein the slave oscillator output bandwidth is between 1 GHz to 90 GHz;
  wherein the slave oscillator is a GHz micro-ring oscillator;
  wherein the master oscillator is a micro-ring resonator;
    wherein the non-directly detectable master oscillator terahertz (THz) frequency input has a minimum bandwidth equal to or greater than ⅔ octave;
      wherein the bandwidth of the master oscillator terahertz (THz) frequency input is between 150 THz to 300 THz.

An embodiment of the invention is a method for frequency division of a non-directly detectable terahertz (THz) frequency timing signal to a directly detectable timing signal. In an exemplary aspect the method includes the steps of providing a slave oscillator having a free-running frequency $f_{rep}$; injection locking the slave oscillator with at least two millimeter wave- or THz range-separated tones of the THz timing signal having a repetition rate $nf_{rep}$ that is a harmonic of $f_{rep}$, where n is an integer, such that the at least two tones are down-converted into a directly detectable output signal in the GHz/microwave domain. In various non-limiting, exemplary embodiments and aspects the method may include one or more of the following steps, features, characteristics, limitations, or functions alone or in various combinations:

comprising providing a slave oscillator that is a mode-locked laser (MLL) photonic integrated circuit (PIC);
  wherein the directly detectable output signal bandwidth is between 1 GHz to 90 GHz.

BRIEF DESCRIPTION OF THE DRAWINGS

FIG. 2a schematically shows an experimental set-up of an optical-to-RF link apparatus to produce the output shown in FIG. 2b, according to an illustrative embodiment of the invention; FIG. 2b schematically illustrates the concept of harmonic multi-tone injection locking using a mode-locked laser (MLL) according to an illustrative aspect of the invention.

DETAILED DESCRIPTION OF NON-LIMITING, EXEMPLARY EMBODIMENTS

Figure 1:
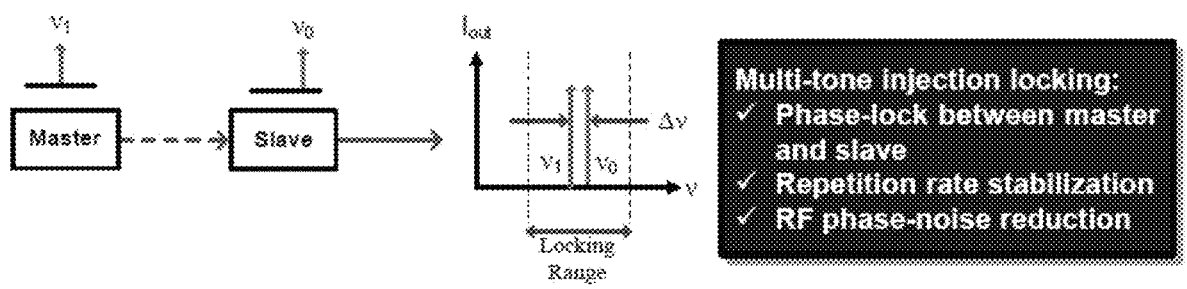
FIG. 1 schematically illustrates the concept of optical injection locking between a slave laser and a master laser as known in the art.

Disclosed embodiments are described with reference to the attached figures, wherein like reference numerals are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships and methods are set forth to provide a more complete understanding of the embodiments disclosed herein.

Generation of widely spaced optical frequency combs are a powerful technology with applications ranging from precision metrology to photonic signal processing. When the carrier-envelope offset, $f_0$, and the repetition rate, $f_{rep}$, are fully known, a frequency comb can be used to make precise time measurements, or to measure Doppler shifts in astronomical objects, amongst others. For some of these applications, compact and robust systems are usually desired. In recent years, the use of chip-scale microresonator-based optical frequency combs, where the frequency separation between optical modes can go as high as ~1 THz, has made possible to consistently obtain a coherent octave. On the other hand, semiconductor-based mode-locked lasers (MLL) provide a compact, robust and reliable technology at repetition rates in the microwave regime (1-10s of GHz) that can be easily photo-detected and controlled. However, due to the high-repetition rate of chip-scale MLLs, the generation of coherent octave spanning supercontinuum needed for $f_0$ detection is challenging due to the low peak power of the pulses. As detailed herein below, we present a way to link the stability acquired in the optical domain (THz or millimeter wave spacing) to the RF domain (1-20 GHz), using a novel harmonic multi-tone injection locking technique of a chip-scale semiconductor MLL.

The embodied architecture involves a widely spaced optical frequency comb with a repetition rate ($f_{rep-OFC}$) in the 100's of GHz or THz regime, such as a microresonator-based optical frequency comb (OFC), whose carrier-envelope offset is known and stabilized but its repetition rate cannot be detected. Then, two or more axial modes of such OFC are optically injected into a second OFC device with repetition rate ($f_{rep-MLL}$) in the microwave range (10's of GHz) OFC, such as a semiconductor-based mode-locked laser (MLL). In this second OFC, the carrier-envelope offset cannot be detected, but the repetition rate can be easily detected and controlled. If the relationship between both repetition rates is harmonic, meaning that:

$$f_{rep-OFC} = \alpha f_{rep-MLL},$$

where $\alpha$ is a positive integer, harmonic injection locking occurs and the MLL is phase-locked to the widely spaced OFC and therefore inherits both the repetition rate, with the harmonic relation presented above, and the carrier-envelope offset. The embodied system serves as a link between the ultra-stable source at a repetition rate $f_{rep-OFC}$ that is undetectable with conventional photodetectors and the lower repetition rate $f_{rep-MLL}$ domain from the mode-locked laser, which ultimately achieves a stable, robust link between the optical and microwave regimes.

FIG. 1 schematically illustrates the general concept of optical injection locking between a slave laser and a master laser, as known in the art. Optical injection locking is the technique where a slave laser is synchronized to a master laser. If the detuning between the two lasers is smaller than the locking range of the slave laser, then the slave laser enters injection locking and synchronizes to the master laser.

FIG. 2b schematically illustrates the general concept behind harmonic multi-tone injection locking. A MLL with a repetition rate $f_{rep}$ is injection locked with two or more tones that are generated at a repetition rate that is a harmonic of $f_{rep}$. In pure injection locking, when the master's optical injected tone matches the locking range of one of the MLL axial modes, injection locking takes place and the MLL slave is effectively synchronized to the master laser. In multi-tone injection locking according to the embodied invention, when the multiple tones of the master laser coincide with adjacent comb lines of the MLL the repetition rate stability from the master is also transferred to the slave. Traditionally, this has been done with a frequency separation that matched the repetition rate of the MLL; however, the embodied method involves optically injecting tones at harmonics of the fundamental repetition rate, thereby down-converting a set of millimeter wave or THz range separated optical tones into the GHz/microwave domain. The embodied technique effectively reduces the linewidth of the individual axial modes, stabilizes the repetition rate, and reduces the RF spectrum phase noise.

FIG. 2a schematically shows an experimental set-up of an optical-to-RF link apparatus to produce the output shown in FIG. 2b. An external cavity continuous-wave (CW) laser is locked to a high-finesse (30 k, FSR=8 GHz) Fabry-Perot Etalon (FPE) to enable low noise and high stability operation of the CW laser. The cavity is locked to the FPE via Pound-Drever-Hall (PDH) frequency stabilization. Light from the CW laser is passed through a phase modulator and an intensity modulator driven at ~30 GHz to generate an electro-optic modulated (EOM) comb, the output of which is then passed through a LCoS-based waveshaper where specific comb lines can be attenuated to obtain optical frequency combs with frequency spacing at 60, 90 and 120 GHz. Finally the light is passed through an attenuator to control the injection power to the slave laser. An InP-based colliding pulse MLL photonic integrated circuit (MLL-PIC) is biased under passive mode-locked operation. The optical pulses obtained from the MLL have an optical bandwidth of 1.8 nm, a pulse width of 3.19 ps, and a repetition rate centered around 10.015 GHz with large phase noise sidebands. The MLL contains a 2×2 multimode interference coupler (MMI) providing an input port for injection locking and an output port to access the pulses from the cavity. The MLL also features an intracavity electro-absorption modulator (EAM) which serves as a photodetector providing a microwave output.

Subsequently, the generated comb is passed through an attenuator to control the amount of optical injected power and a polarization controller to match the polarization of the MLL-PIC. This light is then optically injected into the MLL cavity though the injection locking port on the PIC.

Figure 3:
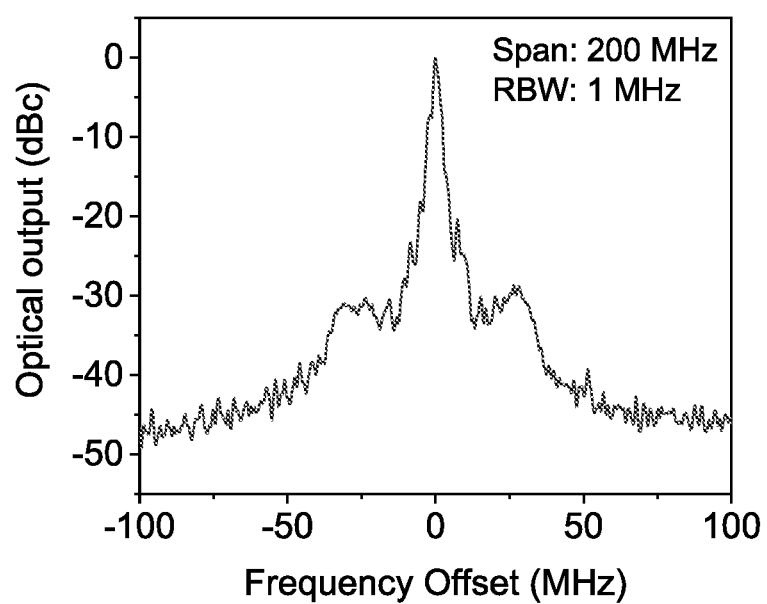
FIG. 3 shows experimental results from harmonic multi-tone injection locking at input comb spacing ranging from 60-120 GHz: a) Optical spectrum centered at ~193 THz of the CW laser used to generate the master optical frequency comb; b) Master OFC output optical spectrum; c) MLL RF spectrum centered at 10 GHz before and after harmonic multi-tone injection locking; d) MLL output optical spectrum before and after harmonic multi-tone injection locking; e) MLL output pulse intensity autocorrelation before and after harmonic multi-tone injection locking, according to an illustrative aspect of the invention.
Figure 3:
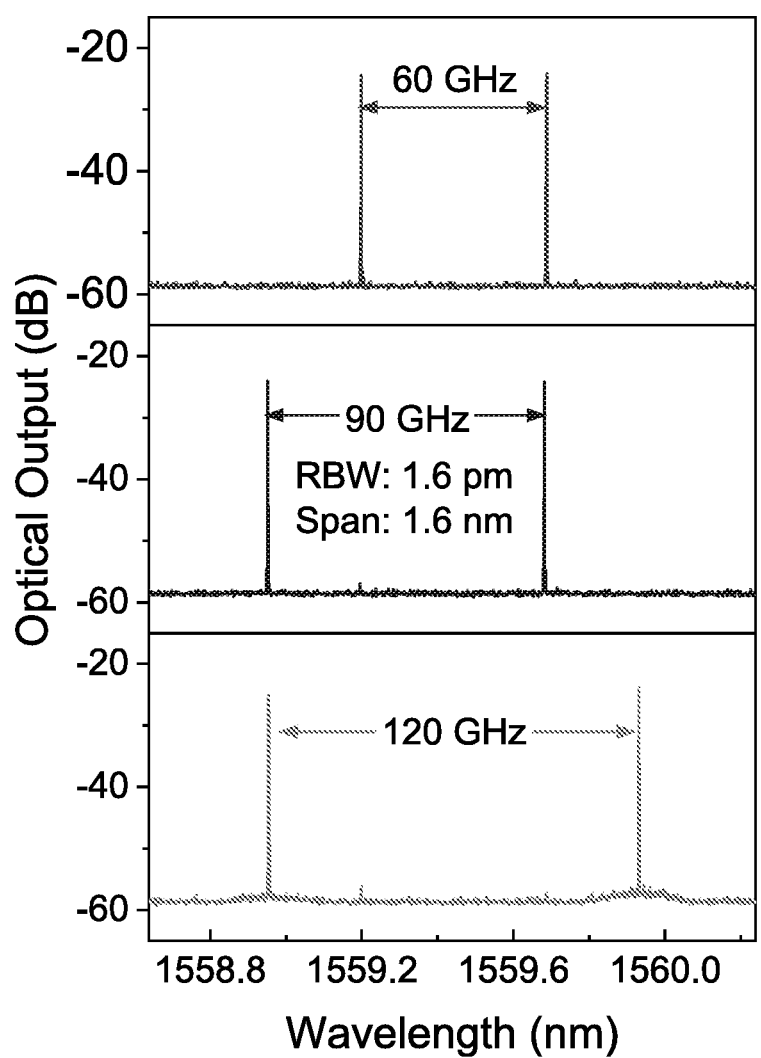
Figure 3:
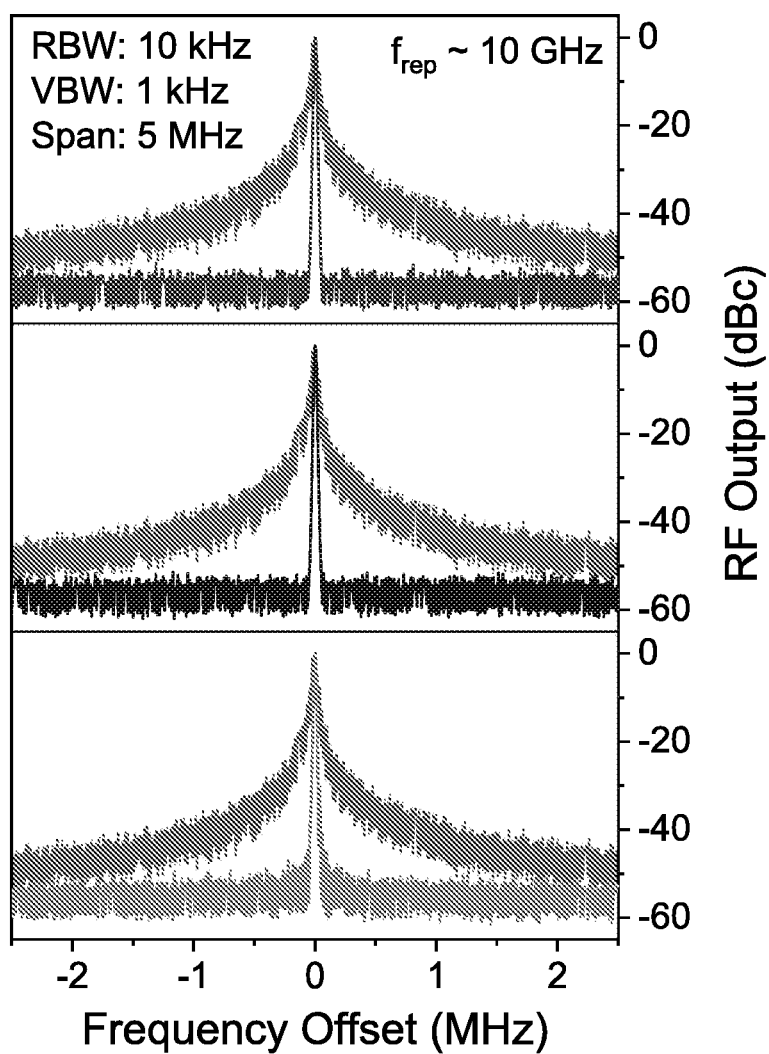
Figure 3:
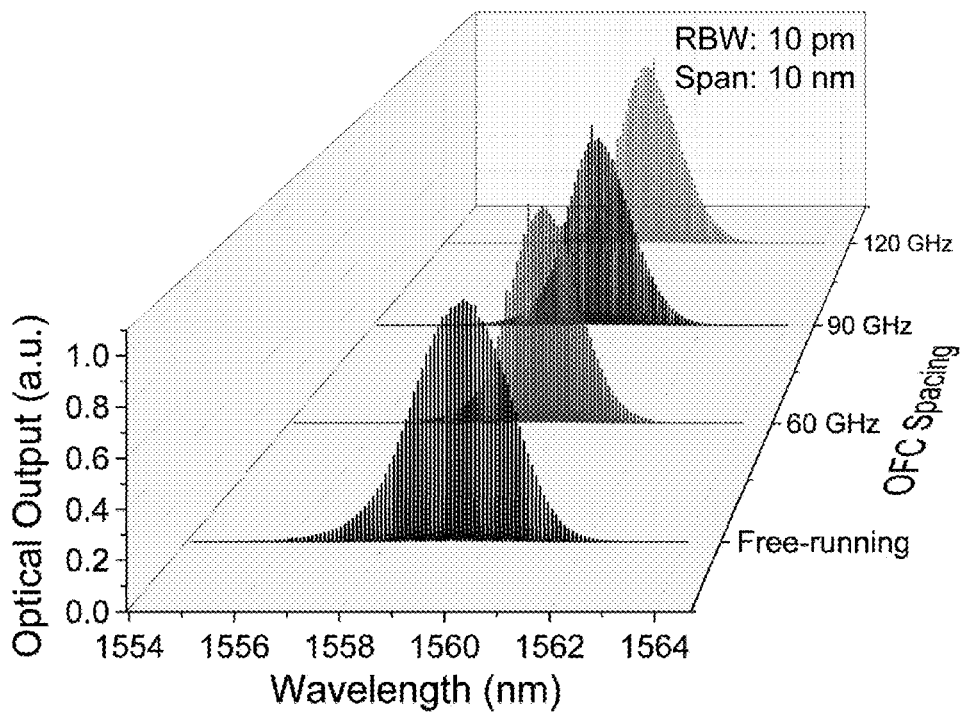

The results of the experiment for input comb spacing ranging from 60 GHz ($6f_{rep}$) to 120 GHz ($12f_{rep}$) are shown in FIG. 3. The photo-detected RF spectrum from the MLL is shown in FIG. 3c. A clear reduction of the phase noise sidebands at 10 GHz of the MLL is observed, which results from the optical injection of the widely spaced optical tones into the MLL-PIC. This clearly demonstrates that the input millimeter wave combs (60-120 GHz) are optically divided down to 10 GHz. The output optical spectrum of the MLL for each input comb spacing is depicted in FIG. 3d. A small reduction of the bandwidth is observed after injection locking and is due to dispersion. The intensity autocorrelation of the output pulses for each of these cases is shown in FIG. 3e. A small broadening of the pulse occurs and corresponds to the bandwidth narrowing effect.

Figure 4:
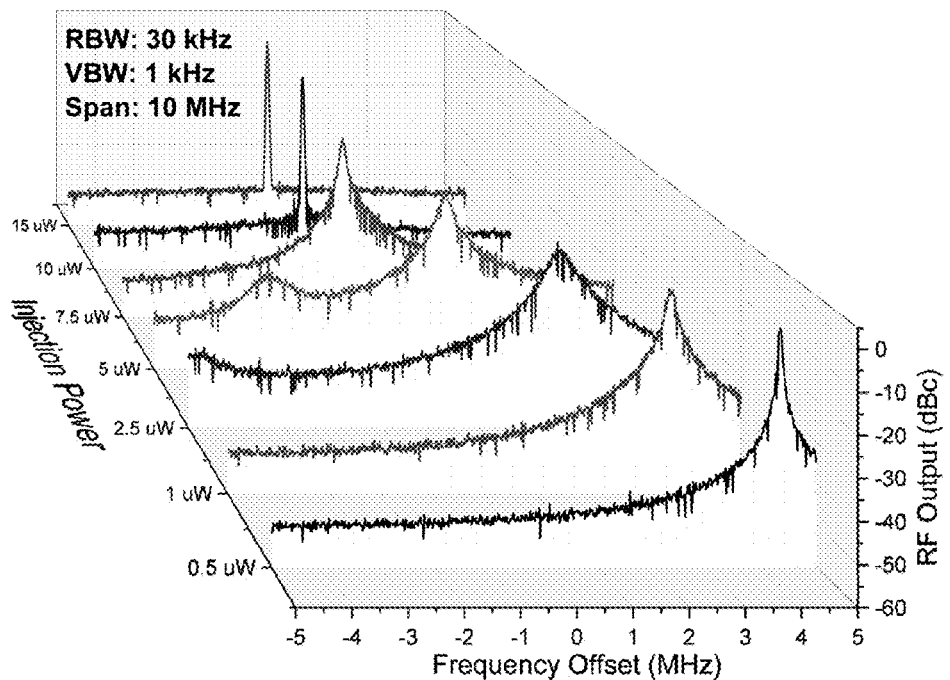
FIG. 4 graphically shows the injection locking power for the input tones separated by 30 GHz between 100 nW to 10 µW: a) MLL RF spectrum for 30 GHz input comb spacing for locking power characterization; b) 30 GHz spacing input comb, according to an illustrative aspect of the invention.
Figure 3:
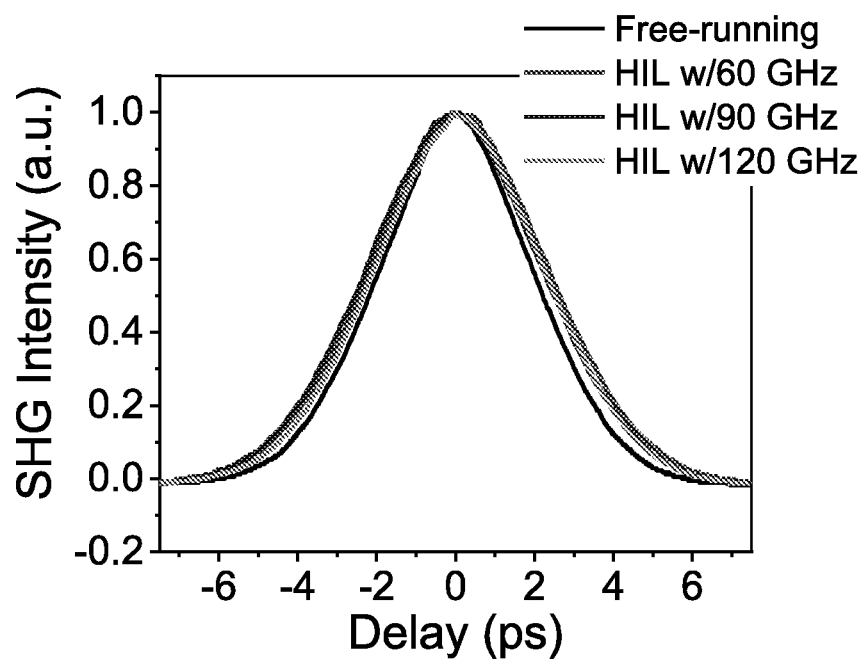
Figure 4:
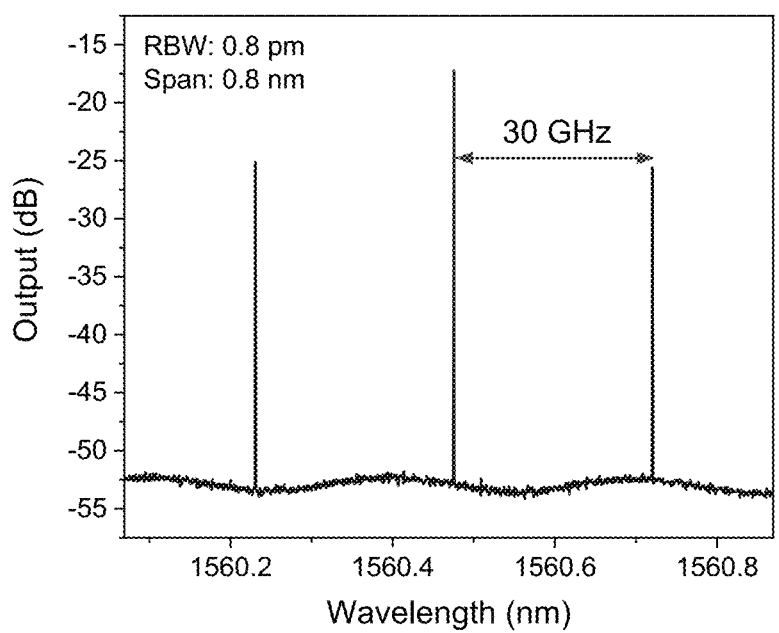

FIG. 4a shows the injection locking power for the input tones separated by 30 GHz between 10 nW to 10 μW. The injection power needed for successful down-conversion is ~10-20 μW, as shown by the reduced phase noise sidebands. The minimum locking bandwidth is 4.3 MHz. FIG. 4b shows the injected 30 GHz spaced comb.

The embodied invention a harmonic multi-tone injection locking apparatus and method to provide a direct optical-to-RF link using optical frequency division. The inventors demonstrated a successful down-conversion of optical tones separated by 120 GHz to 10 GHz using a chip-scale MLL. The inventors believe that the tone separation can be extended to frequencies of 100 GHz and higher.

Figure 5:
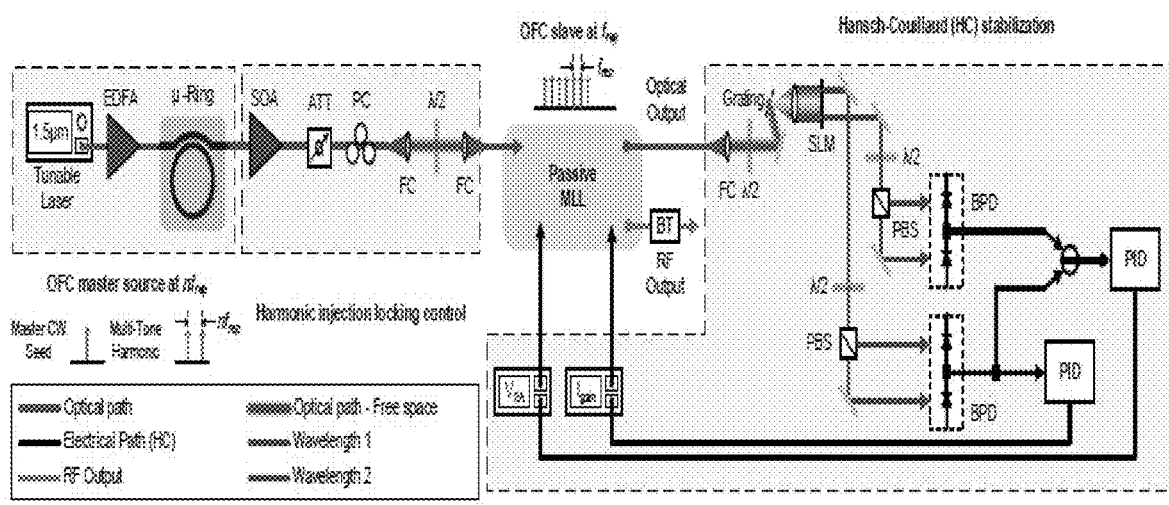
FIG. 5 schematically illustrates an experimental set-up of an optical-to-RF link apparatus coupled to a Hansch-Couillaud stabilization circuit for added stabilization, according to an embodiment of the invention.

The embodied system may also incorporate long-term stabilization based on polarization spectroscopy known as Hansch-Couillaud passive stabilization as shown in FIG. 5. The passive stabilization technique is based on measuring the difference between polarizations coming out of the slave laser and using that difference as an error signal to lock the two lasers in a more robust system against long-term environmental fluctuations. In the embodied technique, instead of reading the polarization differences of only the optical tone that is injected by the master, we measure the two tones injected by the master, locking simultaneously $f_0$ and $f_{rep}$. Given that the system uses chip-scale elements to work, it offers a clear path to photonic integration.

Notwithstanding that the numerical ranges and parameters setting forth the broad scope of the disclosed embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

While various disclosed embodiments have been described above, it should be understood that they have been presented by way of example only and not as a limitation. Numerous changes to the disclosed embodiments can be made in accordance with the specification herein without departing from the spirit or scope of this specification. Thus the breadth and scope of this specification should not be limited by any of the above-described embodiments; rather, the scope of this specification should be defined in accordance with the appended claims and their equivalents.

We claim:

1. A timing signal generator, comprising:
   a slave oscillator having a free-running frequency that is a sub-harmonic of a non-directly detectable master oscillator terahertz (THz) frequency input to the slave oscillator,
   wherein when the slave oscillator free-running frequency is injection locked by the non-directly detectable master THz frequency, the slave oscillator has an output in a bandwidth that is directly detectable.

2. The timing signal generator of claim 1, wherein the slave oscillator output is at least one of directly optically detectable and directly electrically detectable.

3. The timing signal generator of claim 1, wherein the slave oscillator is a mode-locked laser (MLL) photonic integrated circuit (PIC).

4. The timing signal generator of claim 3, wherein the MLL-PIC comprises a ring laser and a 2×2 multimode interference coupler.

5. The timing signal generator of claim 3, wherein the slave oscillator output bandwidth is between 1 GHz to 90 GHz.

6. The timing signal generator of claim 1, wherein the master oscillator is a micro-ring resonator.

7. The timing signal generator of claim 6, wherein the non-directly detectable master oscillator terahertz (THz) frequency input has a minimum bandwidth equal to or greater than ⅔ octave.

8. The timing signal generator of claim 7, wherein the bandwidth of the master oscillator terahertz (THz) frequency input is between 150 THz to 300 THz.

9. A method for frequency division of a non-directly detectable terahertz (THz) frequency timing signal to a directly detectable timing signal, comprising:
   providing a slave oscillator having a free-running frequency $f_{rep}$;
   injection locking the slave oscillator with at least two millimeter wave- or THz range-separated tones of the THz timing signal having a repetition rate $nf_{rep}$ that is a harmonic of $f_{rep}$, where n is an integer, such that the at least two tones are down-converted into a directly detectable output signal in the GHz/microwave domain.

10. The method of claim 9, comprising providing a slave oscillator that is a mode-locked laser (MLL) photonic integrated circuit (PIC).

11. The method of claim 9, wherein the directly detectable output signal bandwidth is between 1 GHz to 90 GHz.

* * * * *